United States Patent [19]

Coburn, Jr. et al.

[11] Patent Number: 4,934,039
[45] Date of Patent: Jun. 19, 1990

[54] PROCESSES OF MANUFACTURING PATTERNS OR GOBOS

[75] Inventors: Joseph W. Coburn, Jr., Lakewood; Joseph W. Coburn, III, Spring Lake Heights, both of N.J.

[73] Assignee: Coburn Corporation, Lakewood, N.J.

[21] Appl. No.: 402,354

[22] Filed: Sep. 5, 1989

[51] Int. Cl.$^5$ .......................... B23P 17/00; C25D 1/08
[52] U.S. Cl. ................................... 29/527.2; 29/163.6; 204/11; 204/15; 430/320; 430/323; 430/324
[58] Field of Search ............................ 29/527.2, 163.6; 204/15, 18.1, 14.1, 14, 11; 430/323, 324, 320

[56] References Cited

U.S. PATENT DOCUMENTS

| | | | |
|---|---|---|---|
| 2,123,297 | 7/1938 | Beynen et al. | 430/324 X |
| 3,046,202 | 7/1962 | Hornes et al. | 204/11 |
| 3,390,992 | 7/1968 | Valles | 204/11 |
| 3,582,476 | 6/1971 | Knisley | 204/11 |
| 3,819,497 | 6/1974 | Grunwald et al. | 204/15 X |
| 4,552,832 | 11/1985 | Blume et al. | 204/14.1 X |

Primary Examiner—Carl E. Hall
Assistant Examiner—Carl J. Arbe
Attorney, Agent, or Firm—R. Gale Rhodes, Jr.

[57] ABSTRACT

Process of manufacturing a metal pattern provided with at least one aperture through which light may be transmitted to project an image on a surface in the shape of the aperture, may include the steps of providing at least a first member extending upwardly from the top surface of a substrate in the shape of the aperture and where the aperture is to be formed in the metal pattern, applying a layer of electrically conductive material to the top surface of the substrate at least around the first member, forming a layer of metal on the layer of electrically conductive material, and peeling the substrate, the upwardly extending first member and the layer of electrically conductive material away from the layer of metal to provide the aperture in the layer of metal and to thereby form the pattern.

18 Claims, 3 Drawing Sheets

PROCESSES OF MANUFACTURING PATTERNS OR GOBOS

BACKGROUND OF THE INVENTION

This invention relates generally to a new and improved processes for manufacturing metal patterns, sometimes referred to in the art as gobos, and to patterns or gobos manufactured by such processes.

As known to those skilled in the art, and referring to the prior art pattern or gobo illustrated diagrammatically in FIG. 1, a pattern or gobo 10 is placed in front of a light projector 12, to project an image 14 on the screen 16 of the stage 18. To project the image 14, the pattern or gobo 10 is provided with an aperture or opening 20 in the shape of the image to be projected, and light rays from the light source 12 pass through the aperture thereby projecting the desired image on the screen 16 such as the Christmas tree shown in FIG. 1. As is further known to those skilled in the art, patterns or gobos are widely used in threatre, film, photography and television to create atmosphere, to project scenery and other imagery and to generally enhance the visual impact of lighting.

Patterns or gobos are presently made by various known prior art processes, such as etching out of a layer of stainless steel, but there exists a need in the art for new, useful and less expensive processes of manufacturing patterns or gobos and patterns and gobos manufactured by such processes.

SUMMARY OF THE INVENTION

It is the object of the present invention to satisfy the above-stated need in the art.

Process of the present invention satisfying such need and for manufacturing a metal pattern provided with at least one aperture through which light may be transmitted to project an image on a surface in the shape of the aperture, may include the steps of providing at least a first member extending upwardly from the top surface of a substrate in the shape of the aperture and where the aperture is to be formed in the metal pattern, applying a layer of electrically conductive material to the top surface of the substrate at least around the first member, forming a layer of metal on the layer of electrically conductive material, and peeling the substrate, the upwardly extending first member and the layer of electrically conductive material away from the layer of metal to provide the aperture in the layer of metal and to thereby form the pattern; pattern or gobo manufactured by such process.

Process of the present invention for manufacturing a circular metal pattern provided with such light transmissive aperture may include the further steps of providing at least a second member extending upwardly from the top surface of the substrate, the second member being generally in the shape of an interrupted circular line surrounding and spaced from the first upwardly extending member, applying the layer of electrically conductive material to the top surface of the substrate at least around the first and second upwardly extending members, forming the layer of metal on the layer of electrically conductive material around the first and second upwardly extending members, peeling the substrate, the first and second upwardly extending members and the layer of electrically conductive material away from the layer of metal, and cutting the layer of metal along the interrupted circular line to form the circular metal pattern; pattern or gobo manufactured by such process.

BRIEF DESCRIPTION OF THE DRAWINGS

FIG. 2 is a top view in perspective of a substrate whose top surface has been covered with a layer of electrically conductive material and on which layer of electrically conductive material layers of non-electrically conductive material have been applied in the shape of the aperture to be formed in the metal pattern and in the shape of the outer boundary of the metal pattern;

FIG. 3 is a diagrammatical illustration, in perspective, of the electroforming step of the present invention;

FIG. 4 is a cross-sectional view taken generally along the line 4—4 in the direction of the arrows in FIG. 2;

FIG. 6 is a diagrammatical top view in perspective of members comprising portions of the polymeric material hardened by the light rays and extending upwardly from the top surface of the substrate and for providing apertures in a layer of metal to be applied to the top surface of the substrate in the shape of the apertures to be formed in the metal pattern and in the shape of the outer boundary of the metal pattern; and FIG. 7 is a cross-sectional view taken generally along the line 7—7 in FIG. 6 and in the direction of the arrows.

DESCRIPTION OF THE PREFERRED EMBODIMENTS

Figure 2:
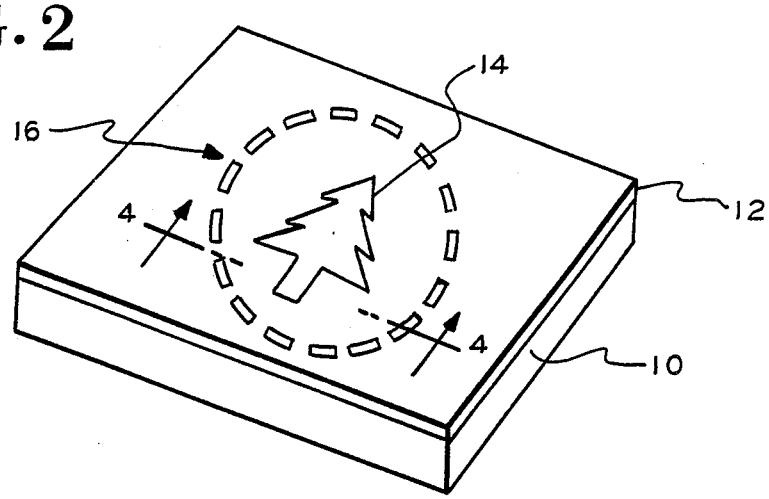
FIGS. 2-4 illustrate a first embodiment of the present invention, more particularly
Figure 3:
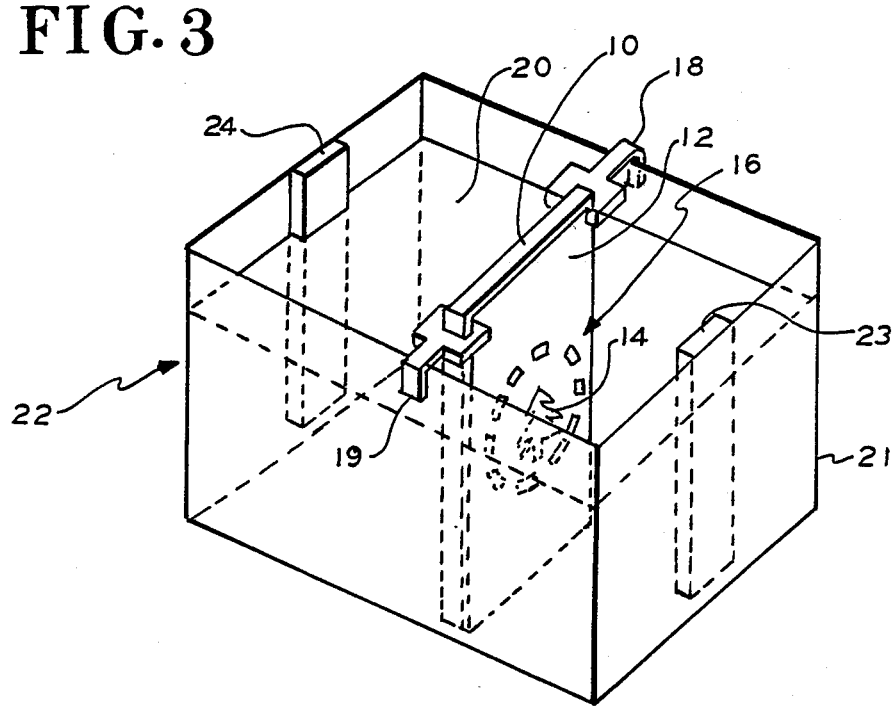
Figure 4:
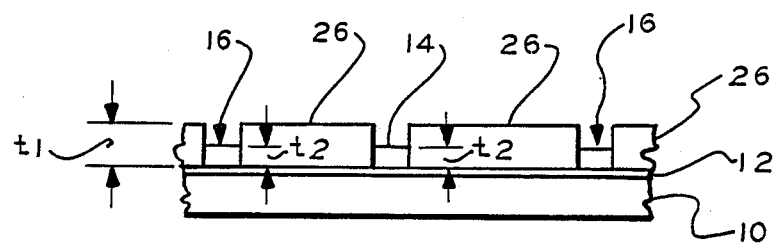

Referring first to FIGS. 2-4 and to the first embodiment of the present invention, and particularly to FIG. 2, a substrate 10 is provided over whose entire top surface a layer of electrically conductive material 12 is applied. A first layer of non-electrically conductive material 14 is applied over a portion of the layer of electrically conductive material 12 in the shape of the aperture to be formed in the metal pattern, namely a Christmas tree, the layer of non-electrically conductive material is located where the aperture is to be formed. A second layer of non-electrically conductive material is applied over a second portion of the layer of electrically conductive material 12 and around and spaced from the first layer of non-electrically conductive material 14, the second layer of non-electrically conductive material is in the shape of an interrupted circular line and is indicated in FIG. 2 by general numerical designation 16; as explained in detail below, the interrupted circular line 16 will form or define the outer boundary of the metal pattern and is located where the outer boundary is to be formed.

Figure 1:
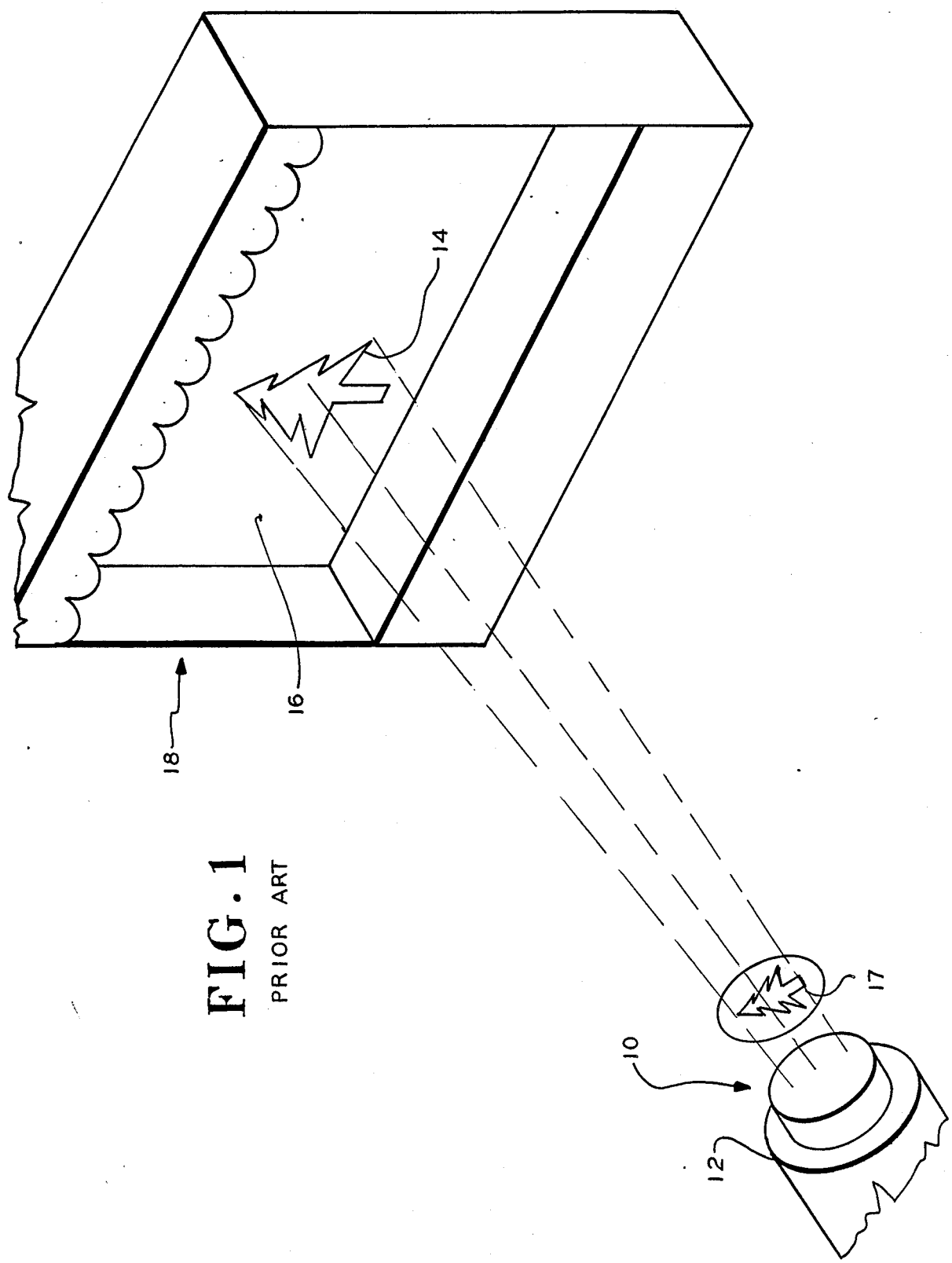
FIG. 1 is a diagrammatical view in perspective illustrating the function of a pattern or gobo.

As illustrated in FIG. 3, the structure of FIG. 1 is supported by suitable clamps 18 and 19 and immersed in a suitable electrolyte 20 contained in a suitable vessel 21 of electroforming apparatus indicated by general numerical designation 22. Apparatus 22 includes an anode 23 and a cathode 24 to which electric current from a suitable source (not shown) is applied. Upon the application of electric current to the anode 23 and cathode 24, metal from the anode 23 is deposited by electrolysis on the entire top surface of the layer of electrically conductive material 12 except where the layers of non-electrically conductive material 14 and 16 have been applied to form the layer of of metal indicated by numerical designation 26 in FIG. 4.

Thereafter, the substrate 10, layer of electrically conductive material 12 and layers of non-electrically conductive material 14 and 16 are peeled away from the layer of metal 26. This peeling provides an aperture in the layer of metal 26 in the shape of the non-electrically conductive material 14, e.g. a Christmas tree, and a plurality of apertures in the shape of an interrupted circle provided by the layer of non-electrically conductive material 16. The layer of metal 26 may be cut along the apertures provided by the layer of non-electrically conductive material 16 to form the outer boundary of the metal pattern which in this embodiment will be circular. Thus, it will be understood that in accordance with the teachings of the present invention the layers of non-electrically conductive material 14 and 16 provide members extending upwardly from the substrate 10 around which the layer of metal 26 is formed as shown in FIG. 4.

With further regard to the embodiment of the present invention illustrated in FIGS. 2 and 4, and in accordance with the further teachings of the present invention, it has been discovered that advantageously the layers of non-electrically conductive material 14 and 16 are applied to the layer of electrically conductive material 12 to a thickness $t_2$, the layer of metal 26 is applied to the layer of electrically conductive material 12 to a thickness $t_1$ and wherein thickness $t_2$ is one-half of or greater than one-half of $t_1$. It has been discovered that this ratio advantageously permits metal patterns to be formed by the above-described process of the present invention within the reasonable limitations to which the layers of non-electrically conductive material 14 and 16 can be applied to the layer of electrically conductive material 12 and prevent the layer of metal 26 from overlapping the tops of the layers of non-electrically conductive material 14 and 16 during the forming of the layer of metal 26 by deposition thereof by electrolysis over the layer of electrically conductive material 12.

The substrate 10, FIGS. 2–4, may be a suitable vinyl, polyester or the like; the layer of electrically conductive material 12 may be by way of example a layer of nickel or silver applied to the top surface of the substrate 10 for example by sputtering, spraying or by metalization of the top surface of the substrate 10, the layers of non-electrically conductive material 14 and 16 may be for example a suitable non-electrically conductive ink, lacquer, or other suitable non-electrically conductive resist, and the layer of metal 26 deposited by electrolysis on the layer of electrically conductive material 12 may be by way of example silver, nickel, or the like. In one embodiment of the present invention, the substrate 10 was vinyl, the layer of electrically conductive material 12 was silver applied to a thickness $t_2$ of approximately 300–1000 angstroms, the layers of non-electrically conductive material 14 and 16 were applied to a thickness $t_2$ of approximately 0.0025 inch, and the layer of metal 26 was nickel applied to a thickness $t_1$ of approximately 0.005 inch.

Accordingly, it will be understood that the process of the present invention described above and illustrated in FIGS. 2–4 forms a metal pattern or gobo, particularly a circular metal pattern or gobo and it will be further understood that such pattern or gobo is a product or article of manufacture of the present invention which has the appearance and function of the metal pattern or gobo 10 of FIG. 1.

Figure 5:
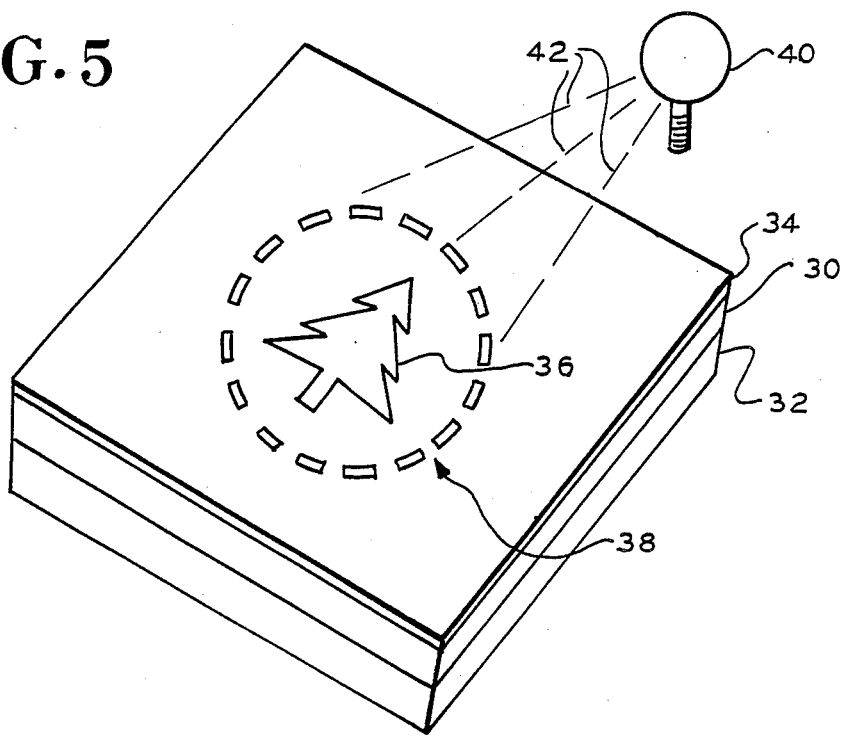
FIGS. 5-7 illustrate a second embodiment of the present invention, more particularly FIG. a diagrammatical top view in perspective of a layer of photopolymeric material adhered to the top surface of an underlying substrate and with a shield or mask being shown over the top surface of the layer of polymeric material, apertures are formed in the shield or mask shape of the aperture to be formed in the metal pattern and in the shape of the outer boundary of the metal pattern, also illustrated is the application of light rays through the apertures formed in the mask or shield to harden portions of the underlying layer of polymeric material in the shape of the aperture to be formed in the metal pattern and in the shape of the outer boundary of the metal pattern.
Figure 6:
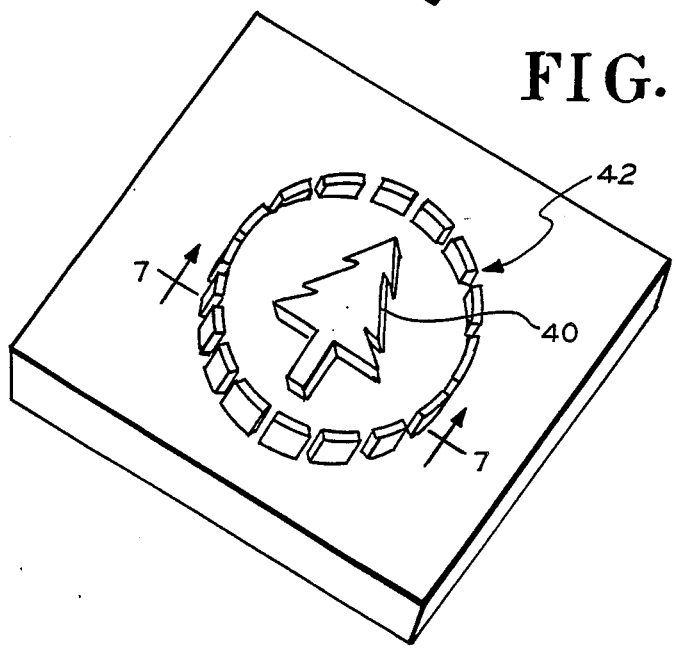
Figure 7:
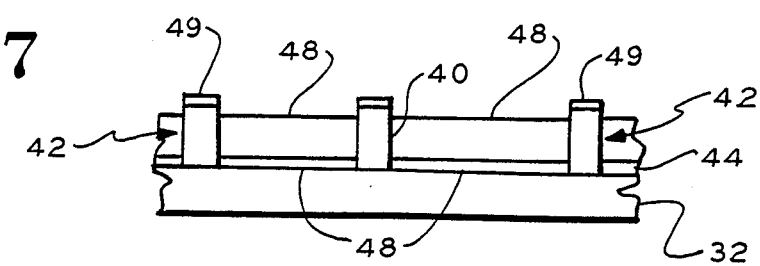

Referring now to the alternate embodiment of the present invention and to FIGS. 5–7, a layer of photopolymeric material 30 is provided and which is suitably adhered to the top surface of an underlying substrate 32. As is known to those skilled in the art, photopolymeric material 30 is hardened by exposure to light rays and thus if a portion of the photopolymeric material 30 is hardened by exposure to light rays, while the remaining portion of the photopolymeric material is not exposed to light rays and therefore is not hardened, the unhardened portion of the photopolymeric material may be dissolved and removed upon immersion in a suitable solvent or dissolvent leaving the hardened portion which is not dissolvable in the dissolvent extending upwardly from the substrate 32 to a height equal to the original thickness of the layer of photopolymeric material 30. Photopolymeric material 30 adhered to the top surface of a substrate 32 may be obtained from the DuPont Company and the Goodyear Company and the substrate 32 is typically polyester.

In accordance with the further teachings of the present invention, an opaque or non-light transmissive shield or mask 34 is placed over the top surface of the layer of photopolymeric material 30. The mask or shield 34 is provided with an aperture 36 in the shape of the aperture to be formed, e.g. a Christmas tree, in the metal pattern and is placed over the layer of photopolymeric material 30 where the aperture is to be formed in the metal pattern A plurality of apertures indicated by general numerical designation 38 is provided in the mask or shield 34 in the shape of an interrupted circular line surrounding and spaced from the aperture 36 and which apertures 38, as taught below, will form or define the outer boundary of the circular metal pattern to be formed.

Light rays from a light source 40 are applied through the apertures 36 and 38 to the areas of the photopolymeric material underlying the apertures to harden the portions of the photopolymeric material 30 underlying the areas thereof exposed to the light rays 42.

The mask or shield 34 is removed and the layer of photopolymeric material and substrate 32 are immersed in a suitable solvent to remove the unhardened portions of the layer of polymeric material leaving the light hardened portions extending upwardly from the top surface of the substrate 32 as illustrated in FIG. 6. It will be understood that in accordance with the teachings of the present invention these hardened portions are upwardly extending members, extending upwardly from the substrate 32, and identified in FIG. 6 by numerical designation 40 and general numerical designation 42, respectively, as shown.

A layer of electrically conductive material 44, FIG. 7, is applied to the top surface of the substrate 32 around the upwardly extending members 40 and 42; layer of electrically conductive material 44 may be the same material as layer of electrically conductive material 12 of FIGS. 2–4 and may be applied to the top surface of the substrate 32 around the upwardly extending members 40 and 42 in the same manner taught above with regard to the layer of electrically conductive material 12.

A layer of metal 48, FIG. 7, is formed over the layer of electrically conductive material 44 and around the upwardly extending members 40 and 42 as illustrated in FIG. 7. It will be understood that the layer of metal 48 may be formed by electroforming in the same manner that the layer of metal 26 was formed on the layer of electrically conductive material 12 in the embodiment of the invention described above and illustrated in FIGS. 2–4, particularly the electroforming illustrated in FIG. 3. However, and in accordance with the further teachings of the present invention, before the structure of FIG. 6 is immersed in the electroforming apparatus, e.g. apparatus 22 of FIG. 3, non-electrically conductive material 49 is applied to the tops of the upwardly extending members prior to such immersion to prevent the metal 48 from forming on the tops of the upwardly extending members Such non-electrically conductive material 49 may be of the same material as the layers of non-electrically conductive material 14 and 16 of FIG. 2. And still further, if desired or required, the non-electrically conductive material 49 may be applied to the tops of the upwardly extending members 40 and 42 prior to application of the layers of electrically conductive material 44.

Referring again to FIG. 7, the substrate 12, layer of electrically conductive material 44, and upwardly extending members 40 and 42 comprised of the hardened portions of the layer of photopolymeric material 30, are peeled away from the layer of metal 48. Such peeling removes the upwardly extending member 40 from the layer of metal 48 to form the aperture in the shape of a Christmas tree in the metal pattern and the members 42 form a plurality of apertures in the shape of an interrupted circular line in the layer of metal 48. The layer of metal 48 is then cut along the interrupted circular line to define or form the outer boundary of the circular metal pattern.

Accordingly, it will be understood that the process of the present invention described above and illustrated in FIGS. 5–7 forms a metal pattern or gobo, particularly a circular metal pattern or gobo, and that a metal pattern or gobo of the present invention is a product or article of manufacture formed by such process having the same appearance and function of the metal pattern or gobo 10 of FIG. 1.

It will be understood that many variations and modifications may be made in the present invention without departing from the spirit and the scope thereof.

What is claimed is:

1. Process of manufacturing a metal pattern provided with at least one aperture through which light may be transmitted to project an image on a surface in the shape of said aperture, comprising the steps of:
    applying a layer of electrically conductive material to one surface of a substrate;
    applying a first layer of non-electrically conductive material over a portion of said layer of electrically conductive material in the shape of said aperture and where said aperture is to be formed in said metal pattern;
    forming a layer of metal over said layer of electrically conductive material except where said first layer of non-electrically conductive material is applied; and
    peeling said substrate, said layer of electrically conductive material, and said first layer of non-electrically conductive material away from said layer of metal to provide said aperture in said layer of metal and to thereby form said metal pattern.

2. Process according to claim 1 wherein said metal pattern is of circular shape, wherein said process includes the further step of applying a second layer of said non-electrically conductive material over a second portion of said layer of electrically conductive material and around and spaced from said first layer of non-electrically conductive material, said second layer of non-electrically conductive material being in the shape of an interrupted circular line; and
    wherein said metal forming step is the step of also forming said layer of metal over said layer of electrically conductive material except where said second layer of non-electrically conductive material is applied; and
    wherein said peeling step is the step of peeling said substrate, said layer of electrically conductive material and said first and second layers of non-electrically conductive material away from said layer of metal; and
    wherein said process includes the further step of cutting said layer of metal along said interrupted circular line to form the outer boundary of said circular metal pattern.

3. Process according to claim 1 wherein said step of applying a layer of electrically conductive material is the step of spraying a layer of electrically conductive material to said one surface of said substrate.

4. Process according to claim 1 wherein said step of applying a layer of electrically conductive material is the step of sputtering a layer of electrically conductive material to said one surface of said substrate.

5. Process according to claim 1 wherein said step of applying a layer of electrically conductive material is the step of metalizing said one surface of said substrate.

6. Process according to claim 1 wherein said step of forming a layer of metal is the step of depositing a layer of said metal by electrolysis over said layer of electrically conductive material except where said first and said second layers of non-electrically conductive material is applied.

7. Process according to claim 1 wherein said step of forming a layer of metal is the step of forming said layer of metal to a thickness of $t_1$ and wherein said step of applying said first and second layers of non-electrically conductive material is the step of applying said first and second layers of non-electrically conductive material to a thickness $t_2$, wherein thickness $t_2$ is one half of or greater than one half of $t_1$.

8. Process of manufacturing a metal pattern provided with at least one aperture through which light may be transmitted to project an image on a surface in the shape of said aperture, comprising the steps of:
    providing a layer of photopolymeric material having a top surface and a bottom surface adhered to the top surface of a substrate;
    shielding said top surface of said layer of photopolymeric material from light rays except for a first area in the shape of said aperture and where said aperture is to be formed in said metal pattern;

applying light rays to said first area to harden a first portion of said layer of photopolymeric material underlying said first area;

removing said layer of photopolymeric material from said top surface of said substrate except for said first hardened portion;

applying a layer of electrically conductive material to said top surface of said substrate around said first hardened portion;

forming a layer of metal over said layer of electrically conductive material and around said first hardened portion; and peeling said substrate, said layer of electrically conductive material and said first hardened portion of said layer of photopolymeric material away from said layer of metal to provide said aperture in said layer of metal and thereby to form said metal pattern.

9. Process according to claim 8 wherein said metal pattern is of circular shape, wherein said process includes the further step of shielding said top surface of said layer of photopolymeric material from light rays except for a second area in the shape of an interrupted circular line surrounding and spaced from said first area;

wherein said step of applying light rays is also the step of applying light rays to said second area to harden a second portion of said layer of photopolymeric material underlying said first area;

wherein said removing step is also the step of removing said layer of photopolymeric material from said top surface of said substrate except for said second hardened portion;

wherein said step of applying a layer of electrically conductive material is also the step of applying said layer of electrically conductive material to said top surface of said substrate around said second hardened portion;

wherein said step of forming a layer of metal is also the step of forming a layer of metal over said layer of electrically conductive material and around said second hardened portion;

wherein said peeling step is also the step of peeling said substrate, said layer of electrically conductive material and said first and second hardened portions of said layer of photopolymeric material away from said layer of metal; and wherein said process includes the further step of cutting said layer of metal along said interrupted circular line to form the outer boundary of said circular metal pattern.

10. Process according to claim 9 wherein said shielding step is the step of applying a layer of opaque material to said top surface of said layer of photopolymeric material except for said first and second areas.

11. Process according to claim 9 wherein said step of applying light rays is the step of applying light rays to said first and second areas to harden said first and second portions of said layer of photopolymeric material.

12. Process according to claim 9 wherein said layer of photopolymeric material is relatively insoluble in a predetermined solvent and wherein said removing step is the layer of dissolving said layer of photopolymeric material with said solvent except for said first and second hardened portions.

13. Process according to claim 9 wherein said step of applying a layer of electrically conductive material is the step of applying said layer of electrically conductive material to said top surface of said substrate around said first and second hardened portions.

14. Process according to claim 13 wherein said step of applying a layer of electrically conductive material is the step of spraying a layer of electrically conductive material to said top surface of said photopolymeric material around said first and second hardened portions.

15. Process according to claim 13 wherein said step of applying a layer of electrically conductive material is the step of sputtering a layer of electrically conductive material to said top surface of said substrate around said first and second hardened portions.

16. Process according to claim 13 wherein said step of applying a layer of electrically conductive material is the step of metallizing said top surface of said substrate around said first and second hardened portions.

17. Process according to claim 9 wherein said step of applying a layer of metal is the step of depositing said layer of metal by electrolysis on said layer of electrically conductive material and around said first and second hardened portions.

18. Process of manufacturing a circular metal pattern provided with at least one aperture through which light may be transmitted to project an image on a surface in the shape of said aperture, comprising the steps of:

providing a first member extending upwardly from the top surface of a substrate in the shape of said aperture and where said aperture is to be formed in the metal pattern;

providing at least a second member extending upwardly from the top surface of said substrate, said second member being generally in the shape of an interrupted circular line surrounding and spaced from said first upwardly extending member;

applying a layer of electrically conductive material to said top surface of said substrate at least around at least said first and second members;

forming a layer of metal on said layer of electrically conductive material and around said first and second upwardly extending members;

peeling said substrate, said upwardly extending first and second members and said layer of electrically conductive material away from said layer of metal to provide said aperture in said layer of metal to thereby form said metal pattern; and cutting said layer of metal along said interrupted circular line to form said circular metal pattern.

* * * * *